US008785850B2

(12) United States Patent
Malac et al.

(10) Patent No.: US 8,785,850 B2
(45) Date of Patent: Jul. 22, 2014

(54) CHARGING OF A HOLE-FREE THIN FILM PHASE PLATE

(75) Inventors: Marek Malac, Edmonton (CA); Marco Beleggia, København (DK); Masahiro Kawasaki, Peabody, MA (US); Ray Egerton, Canmore (CA)

(73) Assignees: National Research Counsel of Canada (CA); Jeol Ltd (JP)

( * ) Notice: Subject to any disclaimer, the term of this patent is extended or adjusted under 35 U.S.C. 154(b) by 480 days.

(21) Appl. No.: 12/930,749

(22) Filed: Jan. 15, 2011

(65) Prior Publication Data
US 2011/0174971 A1    Jul. 21, 2011

Related U.S. Application Data

(60) Provisional application No. 61/336,256, filed on Jan. 19, 2010.

(51) Int. Cl.
*H01J 37/295* (2006.01)
*B82Y 35/00* (2011.01)

(52) U.S. Cl.
CPC ............... *H01J 37/295* (2013.01); *B82Y 35/00* (2013.01)
USPC ........................................................ 250/311

(58) Field of Classification Search
USPC ......................................... 250/306, 307, 311
See application file for complete search history.

(56) References Cited

U.S. PATENT DOCUMENTS

| | | |
|---|---|---|
| 3,596,090 A | 7/1971 | Hoppe |
| 5,814,815 A | 9/1998 | Matsumoto et al. |
| 6,744,048 B2 | 6/2004 | Hosokawa et al. |
| 2002/0011566 A1* | 1/2002 | Nagayama et al. ........... 250/311 |
| 2003/0066964 A1* | 4/2003 | Nagayama et al. ........... 250/311 |
| 2004/0188608 A1* | 9/2004 | Kaneyama .................... 250/311 |
| 2008/0035854 A1* | 2/2008 | Jin et al. .................... 250/396 R |
| 2008/0202918 A1 | 8/2008 | Nagayama et al. |
| 2009/0166558 A1* | 7/2009 | Nagayama .................... 250/311 |
| 2009/0168142 A1* | 7/2009 | Nagayama .................... 250/311 |

FOREIGN PATENT DOCUMENTS

WO    2007022862    3/2007

OTHER PUBLICATIONS

Radostin Danev, Kuniaki Nagayama, Transmission electron microscopy with Zernike phase plate, Ultramicroscopy, vol. 88, Issue 4, Sep. 2001, pp. 243-252, ISSN 0304-3991, 10.1016/S0304-3991(01)00088-2.*

(Continued)

*Primary Examiner* — Phillip A Johnston
*Assistant Examiner* — Brooke Purinton
(74) *Attorney, Agent, or Firm* — Raggio & Dinnin, P.C.

(57) ABSTRACT

New methods for phase contrast imaging in transmission electron microscopy use the imaging electron beam itself to prepare a hole-free thin film for use as an effective phase plate, in some cases eliminating the need for ex-situ fabrication of a hole and reducing requirements for the precision of the ZPP hardware. The electron optical properties of the ZPP hardware are modified primarily in two ways: by boring a hole using the electron beam; and/or by modifying the electro-optical properties by charging induced by the primary beam. Furthermore a method where the sample is focused by a lens downstream from the ZPP hardware is disclosed. A method for transferring a back focal plane of the objective lens to a selected area aperture plane and any plane conjugated with the back focal plane of the objective lens is also provided.

7 Claims, 7 Drawing Sheets

(56) References Cited

OTHER PUBLICATIONS

Phase contrast electron microscopy: development of thin-film phase plates and biological applications Kuniaki Nagayama, Radostin Danev Philos Trans R Soc Lond B Biol Sci. Jun. 27, 2008; 363(1500): 2153-2162. Published online Mar. 13, 2008.*
Batson, P. "Motion of Gold Atoms on Carbon in the Aberration-Correction STEM", Microsc. Microanal., vol. 14, p. 89-97, 2008.
Cambie et al., "Design of a Microfabricated, Two-Electrode Phase-Contrast Element Suitable for Electron Microscopy", Ultramicroscopy, vol. 107, p. 329-339, 2007.
Cazaux, J. "Correlations between ionization radiation damage and charging effects in TEM", Ultramicroscopy, vol. 60, p. 411-425, 1995.
Cazaux, J., "Some Considerations on the Electric Field Induced in Insulators by Electron Bombardment", J. Appl. Phys., vol. 59(5), p. 1418-1430, 1986.
Chen et al., "Study of Mean Absorptive Potential Using Lenz Model: Toward Quantification of Phase Contrast from an Electrostatic Phase Plate", Micron vol. 39, p. 749-756, 2008.
Curtis et al., "The Electric Charging of Electron-Microscope Specimens", Brit. J. Appl. Phys. (J. Phys. D.),vol. 2, p. 1035-1040, 1969.
Danev et al., "Practical factors affecting the performance of a thin-film phase plate for transmission electron microscopy", Ultramicroscopy, vol. 109, 312-325, 2009.
Downing et al., "Experimental characterization and mitigation of specimen charging on thin films with one conducting layer", Microsc. Microanal., vol. 10, p. 783-789, 2004.
Egerton, R. "Basic questions related to electron-induced sputtering in the TEM", Ultramicroscopy, vol. 110, p. 991-997, 2010.
Egerton, R., "Radiation damage in the TEM and SEM", Micron. vol. 35, p. 399-409, 2004.
Egerton, R., "Electron Energy-Loss Spectroscopy in the Electron Microscope", 2nd ed., ch. 3, Plenum Press, 1996.
Glaeser et al., "Specimen charging on thin films with one conducting layer: discussion of physical principles", Microsc. Microanal., vol. 10, p. 991-997, 2010.
Harada et al., "Optical system for double-biprism electron holography", Journal of Electron Microscopy, vol. 54(1), p. 19-27, 2005.
Henderson, R. "The potential and limitations or neutrons, electrons and x-rays for atomic resolution microscopy of unstained biological molecules", Quarterly Reviews of Biophysics, vol. 28(2), p. 171-193, 1995.

Hosokawa et al., "Transfer doublet and an elaborated phase plate holder for 120 kV electron-phase microscope", Journal of Electron Microscopy, vol. 54(4), p. 317-324, 2005.
Howie, A., "Hunting the Stobbs factor", Ultramicroscopy, vol. 98, p. 73-79, 2004.
Ichikawa et al., "Electron holographic analysis of nanostructured gold catalyst", JEOL News, vol. 38(1), p. 6-9, 2003.
Krassimir et al., "Electric charging of thin films measured using the contrast transfer function", Ultramicroscopy, vol. 87, p. 45-54, 2001.
Krassimir et al., "Reconstruction of the electric charge density in thin films from the contrast transfer function measurements", Ultramicroscopy, vol. 90, p. 85-95, 2002.
Krivanek O. L., "A method for determining the coefficient of spherical abberation from a single electron micrograph", Optik, vol. 45(1), p. 97-101, 1976.
Majorovits et al., "Optimizing phase contrast transmission electron microscopy with an electrostatic (Boersch) phase plate", vol. 107, p. 213-226, 2007.
Malac et al., "Bright-field TEM imaging of single molecules: Dream or near future?", Ultramicroscopy, vol. 107, p. 40-49, 2007.
Malac et al., "Convenient electron optics set up for Zernike phase microscopy in TEM", Microsc. Microanal., vol. 15 (suppl 2), p. 1234-1235, 2009.
Malac et al., "Imaging of radiation sensitive-samples in transmission electron microscopes equipped with Zernike phase plates", Ultramicroscopy, vol. 108, p. 126-140, 2008.
Matsumoto et al., "The phase constancy of electron waves traveling through Boersch's electrostatic phase plate", Ultramicroscopy Letter, vol. 63, p. 5-10, 1996.
Qu et al., "Quantitative measurement of image intensity in transmission electron microscope images", Applied Surface Science, vol. 252, p. 3984-3988, 2006.
Reimer, L. "Transmission Electron Microscopy", 4th ed., vol. 36, ch. 1, 3, 6, 11, Verlag Springer, 1997.
Schutleis et al., "Fabrication of a Boersch phase plate for phase contrast imaging in a transmission electron microscope", Review of Scientific Instruments, vol. 77, p. 033701-1-033701-4, 2006.
Schiue et al., "Phase TEM for biological imaging utilizing a Boersch electrostatic phase plate: theory and practice", Journal of Electron Microscopy, vol. 58(3), p. 137-145, 2009.
Zernike, F. "Phase contrast, a new method for the microscopic observation of transparent objects", Physica IX, No. 7, p. 686-698, 1942.

* cited by examiner

CHARGING OF A HOLE-FREE THIN FILM PHASE PLATE

CROSS REFERENCE TO RELATED APPLICATIONS

This instant application claims the benefit of prior U.S. Provisional Application Ser. No. 61/336,256 filed on Jan. 19, 2010.

FIELD OF THE INVENTION

The invention relates in general to the field of transmission electron microscopy, and in particular, to preparing a transmission electron microscope (TEM) for phase contrast imaging of phase objects using a hole-free thin film in a way that facilitates the manufacturing, and alignment of a phase plate.

BACKGROUND OF THE INVENTION

Zernike phase contrast imaging in a TEM increases contrast of phase objects in comparison to traditional (bright field) phase imaging, leading to decreased electron irradiation dose for a desired signal-to-noise ratio. Many samples of practical interest in TEM are sensitive to electron beam irradiation because their nature changes with increasing incident electron dose, and care must be taken to avoid artefacts [2-4]. The radiation damage is of serious concern to biological samples [4] as well as to characterization of small metal particles [5].

Zernike phase contrast imaging is achieved by placing a Zernike phase plate (ZPP) in a diffraction plane (or a plane conjugated with the diffraction plane) of a TEM to provide different electron path lengths for electrons scattered by the sample with respect to electrons that were not scattered. This is performed by separating a beam of the electrons into two components that will strike the ZPP at different positions: unscattered beam strikes the phase plate at a centre of the ZPP, while the electron beams scattered by the sample strike the ZPP outside the centre. The separation of scattered and unscattered electrons is based on the angles at which they emerge from the sample: the unscattered electrons travel on a substantially direct path while the electrons scattered by the sample travel at an angle relative to optical axis of the microscope. This separation of the scattered and unscattered electrons is provided by lens action of a lens focussing the unscattered waves to a tiny point at the center of the ZPP where there is a hole, while the remainder of the beams is spread across the ZPP, and, passing through the phase plate, acquires a phase offset with respect to the unscattered waves. Traditionally a hole or a local electrostatic field is placed in the centre of the ZPP and a phase shift difference (typically $\pm\pi/2$ rad) is acquired between the electrons passing through the centre of the ZPP and the beams passing outside the centre of the ZPP. The phase shift difference is induced either by thickness of the material (such as carbon) and its mean inner potential or by an applied electrostatic field in vacuum near the centre of the ZPP (referred to as Boersch or einzel lens). There are many variants of Zernike phase contrast imaging referred to as Hilbert, Chapman, Coherent Foucault imaging, etc. All of these techniques use phase plates having the center hole, and thus their phase plates are referred to herein as Zernike phase plates.

There are several problems with ZPPs that have been previously viewed as separate issues. ZPPs require a precise hole in a carbon film or a Boersch lens or einzel lens to be fabricated at the ZPP centre; then they are very difficult to align precisely on standard TEMs; and, in operation, can suffer defects due to "charging". Due to the strict fabrication and positioning requirements they can also be expensive to manufacture and install.

Presently, ZPPs are produced by micromachining a substrate to define a Boersch or einzel lens or by using amorphous thin films with a hole of precise dimensions. In either case a hole (thin film ZPP), or a hole and a complicated electrode system (Boersch or einzel lens) is fabricated in a suitable material. Fabrication of a precise hole or electrode system a few hundred nanometers in lateral dimensions is generally challenging, and is typically performed with a focused ion beam or using micro-electro-mechanical fabrication methods. Both of these are expensive, as they require expensive equipment, and typically require multiple fabrication steps. High precision markers are typically required on the ZPP to permit alignment later on.

Boersch lens or einzel lens type ZPPs, also known as electrostatic-type ZPPs, require a complicated electrode system formed in a suitable thin film. Supporting these electrodes in alignment about a central axis with small borehole while ensuring adequate electrical isolation, and good mechanical support with a structure that minimizes interference with the electron beam in use, is challenging. These ZPPs are currently formed by micromachining (e.g. using micro-electro-mechanical systems) a substrate and deposition of conductors in a multi-step process.

For example, US2008/0035854 to Jin Jian et al. teaches a particular ZPP having a small hole and a method for microfabricating it. According to Jin Jian, phase plates are fabricated by employing several combined microfabrication techniques, including x-ray photolithography and electroplating or electroless plating.

The precise fabrication of holes in ZPPs (both thin film and electrostatic types) usually requires a focused ion beam (FIB). Unfortunately FIBs can lead to contamination of the device and damage by gallium ions. It is the hole fabrication and the need for FIB instruments that prevents many laboratories from pursuing phase contrast imaging.

Once produced, it is equally or more challenging to install the ZPP within the TEM, such that the hole is centered within the TEM so that in operation the unscattered beam passes through the hole. Typically the ZPP is positioned with piezoelectric transducers and/or sophisticated deflection equipment. It is known in the art have to place a phase plate at a back focal plane of a TEM. Unfortunately, in standard TEMs, the back focal plane of the objective lens is located in the polepiece gap, which is not wide. In some cases the polepiece gap is a fraction of a centimeter. The polepiece gap needs to accommodate the sample holder and the ZPP hardware leaving a few millimeters at most to accommodate the ZPP hardware. This is makes it all the more difficult to align and limits the ZPP hardware that can be used for positioning with respect to the electron beam.

The complications involved in this placement, as well as the great precision required for alignment has led to other suggestions that involve adding one or more transfer lenses specifically for use in the phase contrast imaging mode, such that a conjugate plane to the back focal plane is produced downstream of the objective lens. Unfortunately there are significant cost disadvantages to including the additional transfer lens, and this generally requires custom built designs, increasing dimensions of the TEM, and further substantially precludes enabling existing TEMs from using phase contrast imaging by retrofit. The transfer lens also leads to compromises in microscope performance in modes of operation other than Zernike phase plate imaging.

Once assembled and centered, ZPPs have known problems with respect to "charging". Charging is an anomalous phase contrast transfer function observed when in phase contrast imaging mode. Jin Jian states that charging can be eliminated by coating the through-hole of the phase plate with a conductor. The anomalous phase contrast transfer function has been attributed to such processes as evaporation of contaminants from the air due to electron-beam etching, as reported in US Patent Application publication no. 2002/011,566 to Nagayama et al. Nagayama et al. teach exposure of the whole phase plate to an initial large dose of electrons, and/or keeping the phase plate at a high temperature to reduce an amount of evaporated materials on the phase plate.

There remains a need for a ZPP that is accessible with lower cost fabrication techniques, and more easily installed. Preferably the ZPP is suitable to implement and operate in a standard TEM. Furthermore, there is a need for a ZPP that is easily positioned for operation at a variety of locations within the TEM, including at a selected area aperture plane of the microscope which in some cases, is desirable.

SUMMARY OF THE INVENTION

Applicants have discovered that Zernike-like phase contrast imaging is achieved by the charging of a suitable hole-free thin film by the incident electron beam itself to produce a suitable phase plate, and has further discovered that a strong primary electron beam can be used to fabricate the through bore in a hole-free thin film in situ to form a standard Zernike phase plate (ZPP). These discoveries permit phase contrast imaging requiring substantially no alignment, as no hole is provided and as the charging is naturally localized near the center of the phase plate in the former case, and in the latter case, substantially no alignment is needed because the hole is bored in situ and the center of the beam is the same for the boring as it is for imaging at conditions identical or similar to the imaging conditions. In both cases the electron beam itself is used to prepare the hole-free thin film for imaging. As both of these techniques obviate the need for precision positioning equipment and sophisticated fabrication of ZPP hardware, the present invention enables simplified phase plate positioning in any plane of the TEM conjugated with the back focal plane (BFP). The use of the electron beam itself to prepare the phase plate for imaging either by hole drilling or by charging, removes the limitations of pre-fabricating a ZPP. The in situ fabricated ZPP has the appropriate hole size for ZPP imaging because the ZPP is prepared by the beam itself during the hole boring. The simplified phase plate hardware (the hole-free thin film) can be easily placed within the objective lens polepiece gap, for example directly in one of the standard holes of the objective aperture strip in a standard TEM.

Applicants have also discovered that there are advantages to using a downstream lens to focus the sample. In the context of the microscope optics used for Zernike phase plate imaging there are several lenses for focusing the sample to choose from. An advantage of using a downstream lens for sample focusing (as opposed to use of objective lens that is located before or upstream of the thin film) is the elimination of problems with a change of position of the back focal plane (or conjugated plane) that happens when sample focus is changed. The typical TEM lensing scheme uses an objective lens for focusing on the sample. Focusing with the objective lens that is upstream of the phase plate, results in movement of the back focal plane along the beam path. Consequently a situation can arise when the back focal plane does not coincide with the position of the phase plate along the beam path and a condenser lens has to be adjusted to accommodate for a change of cross-over position. The use of a post-phase-plate lens is therefore significantly more convenient.

The applicant also noted that placing the phase plate at a selected area aperture plane (SAA), that can be made conjugate plane to the back focal plane, has practical advantages over the set up with transfer lens[24] or the traditional set up where ZPP is placed in the back focal plane of the objective lens. The SAA of a TEM generally has more space available for the ZPP than the back focal plane of the microscope. At the SAA plane, the diffraction pattern can be either demagnified or magnified or of the same size as at the back focal plane of the objective lens.

A method is provided for phase contrast imaging with a transmission electron microscope including an electron beam emitter and condenser lens, a sample holder, an objective lens assembly, one or more intermediate lenses, and an object plane. The method comprises placing a hole-free thin film at a back focal plane of the objective lens assembly, or at a plane conjugate thereto, preparing the hole-free thin film for phase contrast imaging using the electron beam having at least a component thereof focused to a point on the hole-free thin film at a center of the electron beam, and subsequently imaging a sample in the sample holder by focusing scattered waves of the electron beam onto the point on the hole-free thin film, while unscattered waves are distributed across the hole-free thin film to impart a phase offset between the scattered and unscattered waves. Preparing the hole-free thin film may involve using the charged beam to modify electro-optical properties of the hole-free thin film to increase the efficiency of phase transfer by charging, or using the charged beam to bore a hole in the thin-film to produce, in situ, a Zernike phase plate.

A method is provided for preparing a transmission electron microscope for phase contrast imaging. This method comprises placing a hole-free thin film at a back focal plane (BFP) or a plane conjugate thereto and then focusing an electron beam of the transmission electron microscope for phase contrast imaging for an initial period of time during which charging and dissipation rates on the thin film are not in balance.

A transmission electron microscope is provided comprising an electron beam source, sample holder, objective lens, and projection system, wherein a hole-free amorphous or crystalline thin film is placed at a back focal plane or a conjugate plane thereof, with the objective lens operated so that an unscattered beam is focused on the back focal plane.

A method for transmission electron microscope imaging is provided. This method comprises: inserting a phase plate into the transmission electron microscope at a back focal plane of the objective lens or a plane conjugate thereto; if the phase plate has a hole or aperture, aligning the hole with a center of an electron beam of the transmission electron microscope; applying fields at objective lenses of the transmission electron microscope to focus the electron beam such that scattered waves from a sample in the transmission electron microscope travel throughout a centre of the phase plate, and unscattered waves from the sample pass through the remainder of the phase element; and subsequently imaging a sample in the sample holder by focusing scattered waves of the charged beam onto the point on the hole-free thin film, while unscattered waves are distributed across the hole-free thin film to impart a phase offset between the scattered and unscattered waves.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIGS. 1a),b),c) are TEM images of substantially amorphous elk fibrils: FIG. 1a) was obtained without a phase plate using traditional phase imaging by applying a defocus, and FIGS. 1b), and 1c) were obtained without defocus using a phase plate consisting of a hole-free thin film formed respectively of carbon and gold;

FIGS. 2a),b),c) are contrast transfer functions for the TEM images of FIGS. 1a),b),c), respectively;

FIGS. 3a)-d) are experiments imaging multiwall carbon nanotubes (MWCNT) with crystalline Pt/Ru nanoparticles: FIG. 3a) was obtained without a phase plate using traditional phase imaging by applying a defocus; FIG. 3b) was obtained using a carbon thin-film phase plate with FIB prefabricated hole; and FIG. 3c) shows contrast transfer functions for the images in FIGS. 3a) and 3b), respectively;

FIGS. 4a),b) are schematic cross-section and top views of a thin film type ZPP;

FIGS. 6a),b) relate to a hole drilling experiment: FIGS. 7a),b) schematically illustrate microscope optics for transferring the back focal plane of the objective lens to the selected area aperture plane by an objective minilens, or for traditional imaging.

DESCRIPTION OF PREFERRED EMBODIMENTS

A technique is provided for phase contrast imaging involving preparing a hole-free thin film for TEM imaging with the electron beam itself focused on a center of the charged beam, which now does not have to be precisely aligned. The preparation involves charging the hole-free thin film, or boring a hole therethrough to produce a conventional ZPP, that is uncharacteristically centered within the TEM without equipment required for submicron alignment.

Charging of Hole-Free Thin Films

Several experiments were performed that demonstrate that a hole-free thin film in use is subject to charging that can produce a phase contrast transfer function (CTF) suitable for phase contrast imaging. Because only the difference between the phase shift experienced by the scattered beam with respect to the incident beam results in phase contrast, the uniform films without a hole were not expected to result in a phase contrast. It is a surprising and counterintuitive result that phase contrast imaging is provided with a simple hole-free thin film. Herein hole-free thin films are those that present no hole to the electron beam, even if at some peripheral edge there may be one or more holes for purposes of alignment or retention of the thin film within the TEM, for example.

Amorphous thin films were deposited using a cryopumped electron beam evaporator and ultra high purity carbon source. Respective thin films were formed by depositing gold and aluminum from a resistively heated source in a system with about $5 \times 10^{-7}$ torr background pressure. All films were deposited directly on the respective selected area aperture discs to ensure good electrical contact. The thin films were held at room temperature at all times. The thin films were deposited at a high rate (1 to 10 Å/s) to ensure low oxidation and contamination during film deposition. The film thickness appropriate for $\pi/2$ phase shift at 200 kV was calibrated by double-biprism electron holography in a Hiatchi HF 3300 TEM equipped with a cold field emission gun.

In all examples herein, a JEOL 2200 FS 200 kV TEM/STEM equipped with a Schottky electron source, in-column energy filter, and a Gatan Ultrascan™ 2 k×2 k slow scan CCD camera, was used. A cryo polepiece was used allowing for electron tomography experiments with ±90° tilt angle range. The vacuum in the TEM was $9 \times 10^{-8}$ ton in the vicinity of the sample and the microscope was dry pumped.

Figure 1:
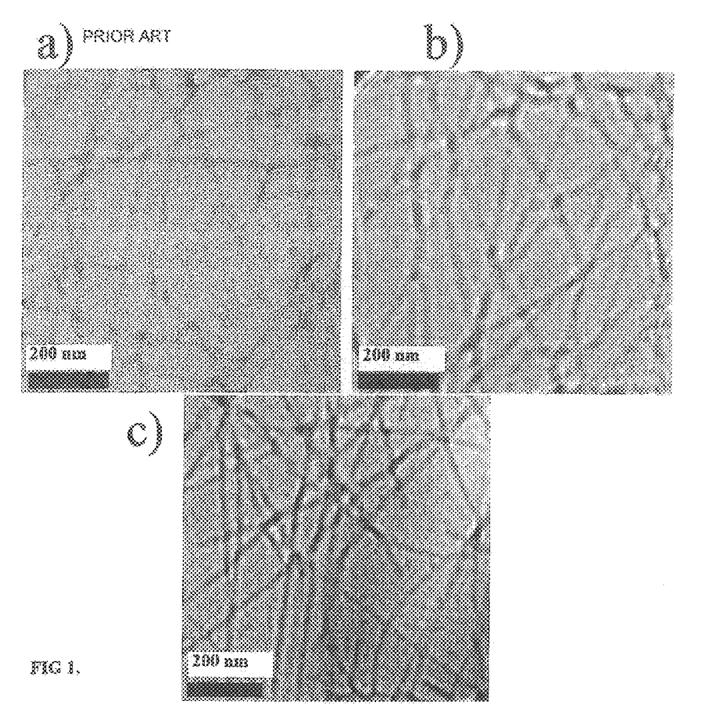

FIGS. 1a),b) and c) are TEM images of substantially amorphous elk fibrils, that are obtained without a traditional ZPP. In FIG. 1a) traditional phase imaging (applying a defocus) is used to produce a phase image. TEM images of the same sample in identical operating mode and focus except that hole-free thin films of carbon (FIG. 1b)) and gold (FIG. 1c)) are positioned at the selected area aperture (which is conjugated with the back focal plane) and no defocus is applied. It is noted that both FIG. 1b) and FIG. 1c) show comparatively higher contrast than FIG. 1a).

After inserting the hole-free thin film in the beam path, the CTF changes with time for an initial period of about 1 min (gold) to about 15 min (carbon). After the initial period the CTF is unchanged for an extended period of time. It was after this period that the images of FIGS. 1b),c) were taken. The significance of using gold thin film material is that gold films are believed to be good conductors and surface layers of contaminants are rarely observed. Nonetheless surface contaminants provide one possible explanation for the CTF observed, and may have a role in producing this phenomenon. It is even possible that surface contaminants are the primary reason for the consequent charging by the incident electron beam due to secondary electron emission.

The change in defocus that appears to recur in all comparisons of images taken using defocus and those taken with various hole-free thin films, demonstrates that there is a phenomenon (herein called 'charging') at work that changes the CTF of the microscope, as if a defocus and an additional phase shift at q=0 were applied. Applicant concludes that charging can be used productively to effect phase contrast imaging on hole-free thin films, as demonstrated by FIG. 1b),c), or further as a correction in amorphous thin film ZPPs (with hole), or other ZPPs that are subject to charging.

Figure 2:
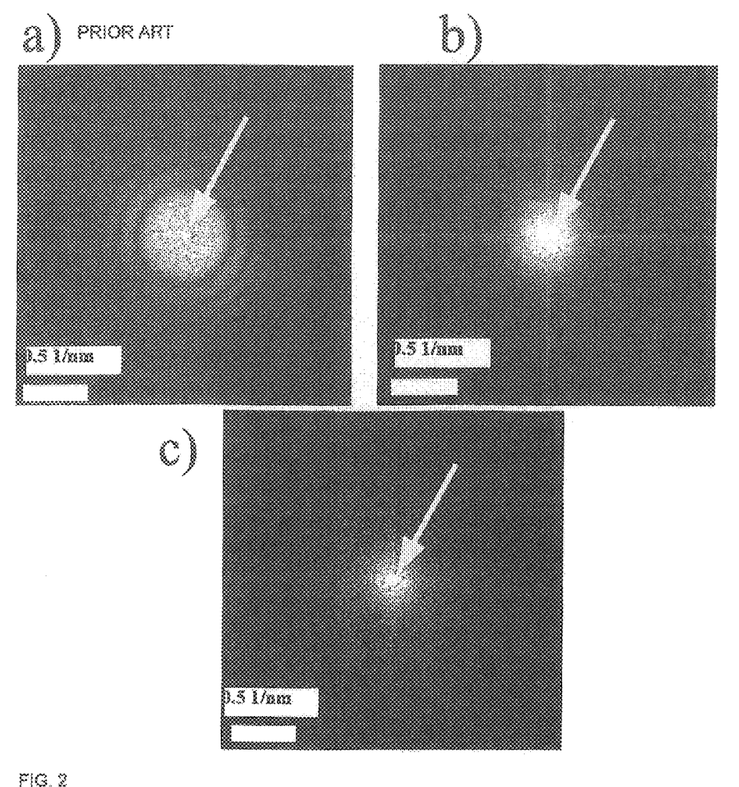

FIGS. 2a),b), and c) show phase contrast transfer functions (CTF), i.e. the power spectra of the images of the elk fibrils taken with defocus phase contrast (FIG. 1a)), a hole-free carbon thin film (FIG. 1b)), and with a hole-free gold thin film phase plate (FIG. 1c)), respectively. Similarly, FIG. 2a) is the CTF of the TEM with the phase plate retracted from the electron beam, and a defocus of about 1000 nm applied.

The CTFs (FIG. 2) depict the modulation of the contrast transfer from phase to amplitude (phase-amplitude mixing). The bright bands near the centres of the CTFs (marked by arrows) represent a transfer band near q=0. The presence of this band demonstrates that the technique provides improved contrast transfer at low spatial frequencies, resulting in enhancement of image contrast. The amount of contrast enhancement can be quantified, and it is about two to three times greater when using hole-free thin films, compared to images taken with defocus only. The deviations of the CTF from circular shape at high spatial frequencies (further from the origin of the graph) in FIG. 2 (as well as in FIG. 3c) (no ZPP) and FIG. 3d) (traditional ZPP)) may be due to sample drift, and/or that charging may not exhibit radial symmetry possibly due to defects in the film or from non-radial symmetry beam current distribution at the back focal plane. The effect is similar to astigmatism and affects high spatial frequencies rather than low spatial frequencies.

Applicants have produced and tested single-layer thin films that are π/2-thick carbon and tested uniform aluminum film and gold film of thickness far exceeding π/2. Even relatively thick gold films exhibit CTF changes that we attribute to charging.

Charging of ZPPs

Furthermore, it is shown that prior art ZPPs with a through hole are subject to charging. Applicants have tested ZPPs where a hole was fabricated in a single-layer carbon and 3-layer carbon-chromium-carbon stacked thin film.

The ZPPs in these experiments were made either of electron-beam evaporated carbon or a multilayer consisting of carbon, chromium and carbon inducing ½π phase shift in each layer, (totaling 3/2π for the multilayer). The chromium layer is intended to increase conductivity of the ZPP to reduce charging. In both cases the technique described above was used for deposition. In general, thin film ZPPs can be formed of carbon with a hole about 0.1 μm to about 2 μm in diameter. For the present experiments with pre-fabricated hole in the ZPP (the traditional set up) the hole diameter in our ZPPs was between 100 nm and about 1.5 μm. The desired dimensions of the ZPP hardware depend on the focal length f of the objective lens and the illumination condition of the TEM.

Figure 4:
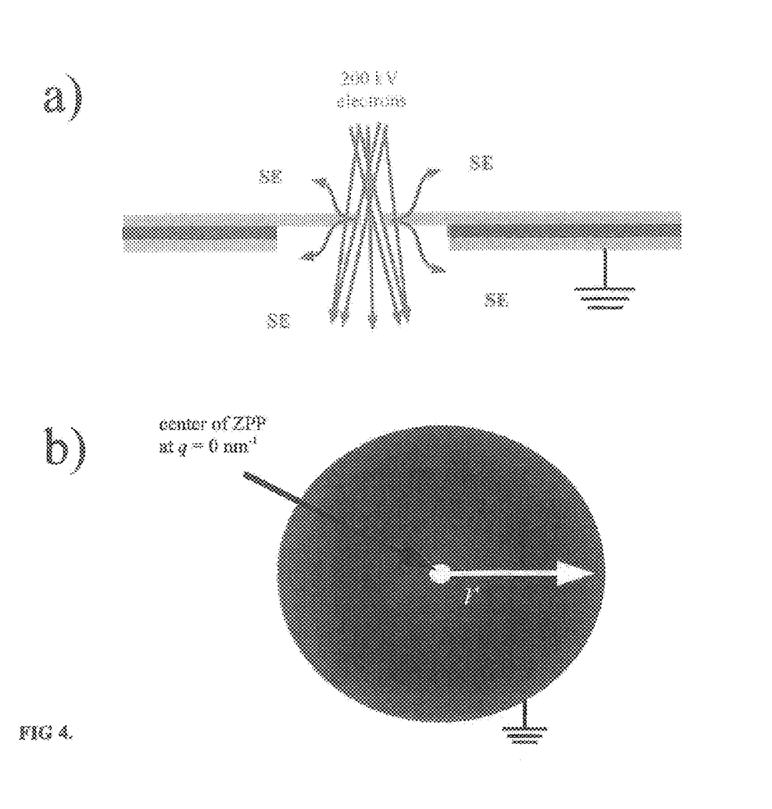

FIG. 4 is a schematic illustration of the multi-layer ZPP in accordance with an embodiment of the invention. FIG. 4a) shows a cross-section of a three-layer ZPP. The 3-layer ZPP was fabricated in a multiple step process. First a self-supporting carbon film π/2-thick was deposited onto a frame of selected area aperture, then a chromium film π/2-thick was deposited onto said carbon film and a large hole was drilled using a focused ion beam. Then a carbon film π/2-thick covering the large hole in chromium+carbon bilayer was floated onto the bilayer. A hole was bored in the single carbon film in the centre of the large hole in the single carbon film in the centre of the large hole in the bilayer using the focused ion beam and a hole was bored in the 3-layer film at a location distant from the carbon single layer.

FIG. 4b) is a schematic illustration of a top view of the traditional ZPP in use, showing the geometrical condition at the back focal plane. The unscattered beam passes through the centre of the ZPP, whereas scattered beams pass outside the centre of the ZPP. The radial distance r varies inversely to the scattering vector q, which in turn corresponds to a spatial frequency transferred by the TEM, because ZPP hardware is placed in the back focal plane of the TEM objective lens or plane a conjugate thereto. The radial distance at the ZPP plane and the scattering vector are related by the effective camera length, determined by the optical parameters, such as focal length of lens above the ZPP, at the plane of the ZPP.

Figure 3:
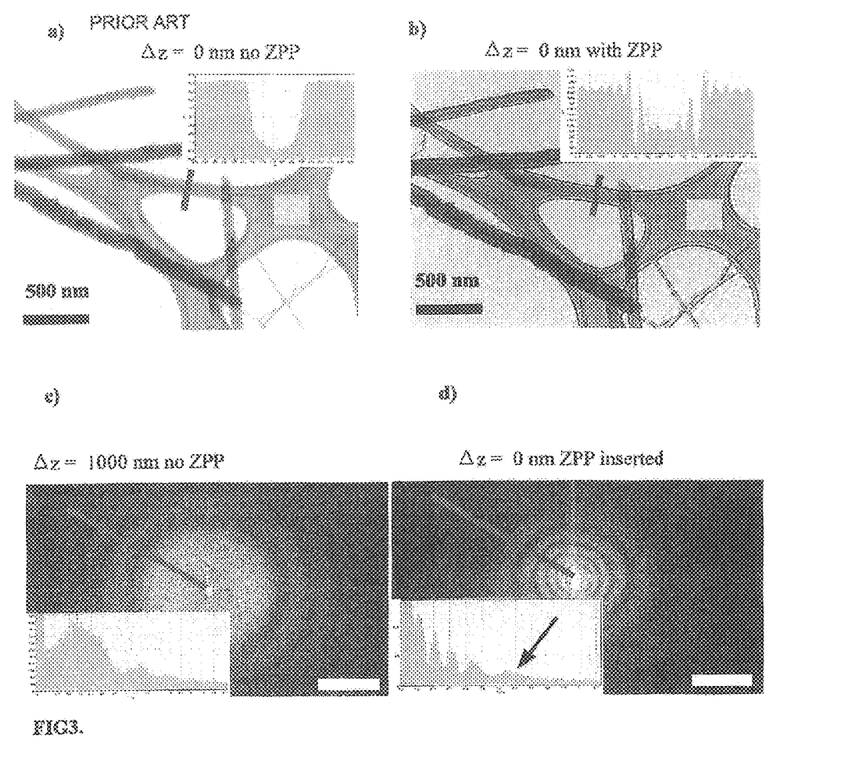

FIG. 3a) is a TEM image of multiwall carbon nanotubes (MWCNT) with crystalline Pt/Ru nanoparticles imaged by phase imaging by defocusing. FIG. 3b) shows the same sample imaged using ZPP (π/2 thick carbon) with a FIB prefabricated hole. FIG. 3c) shows a CTF from the support film area marked by a pale square in FIG. 3a), and FIG. 3d) shows a CTF from the support film area marked by the pale square in FIG. 3b).

Figure 7:
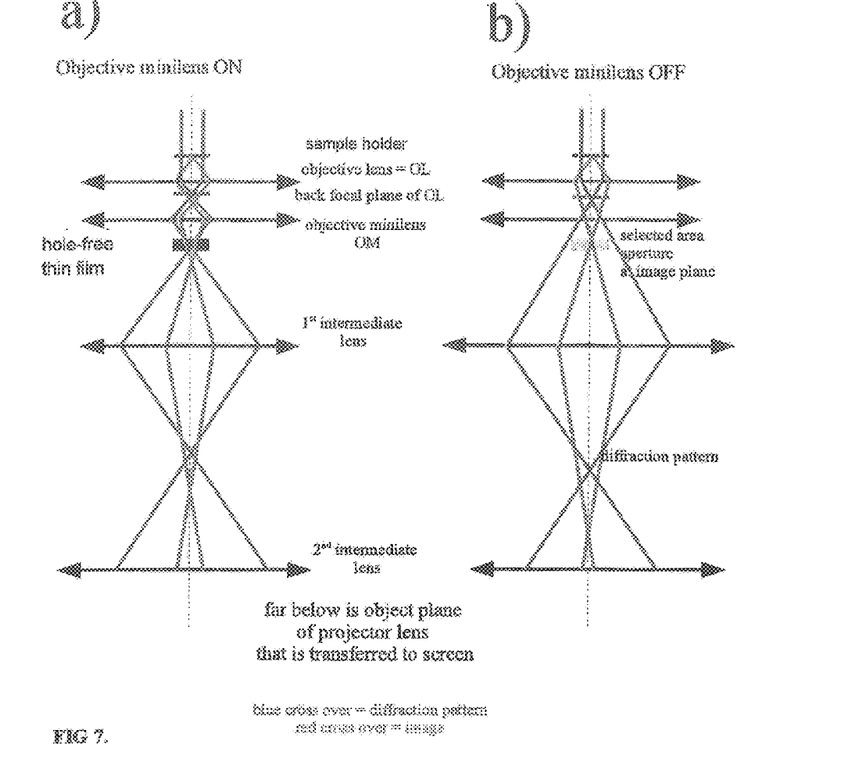

The defocus for the image acquired without ZPP in FIG. 3a) and the corresponding CTF in FIG. 3c) was about 1000 nm. The (FIG. 3b) image was obtained by setting a Gaussian focus before the ZPP was inserted, followed by insertion of amorphous carbon thin film ZPP. The focus of objective lens (OL) and objective minilens were not changed, and care was taken to ensure that the ZPP was in the SAA plane, and thus was conjugated with the back focal plane of the OL (as depicted in FIG. 7). A change of defocus with insertion of ZPP induced Fresnel fringes (profile shown in inset graph of FIG. 3b)). Consequently it was concluded that the contrast fast oscillations in the contrast transfer function (CTF) in FIG. 3d) are associated with the ZPP, rather than any change of the lens of the microscope. A change of apparent defocus is therefore evident when a ZPP with a hole is inserted into the TEM. Such a spontaneous change in focus is consistent with charging of the ZPP hardware.

FIG. 3c) shows the CTF of the TEM image using defocus, while FIG. 3d shows a CTF of a microscope with FIB-prefabricated hole in a carbon thin film ZPP. The band marked by an arrow in FIG. 3d can not be attributed to defocus, lens spherical aberration, or presence of π/2 phase shift from the ZPP. The CTF shown in FIG. 3d), cannot be fitted to the expected CTF using the defocus z and spherical aberration $C_S$. In particular, the transfer band marked by an arrow in FIG. 3d) distinguishes the measured CTF from the CTF of a microscope equipped with an ideal π/2-thick ZPP. This might be attributed to contamination buildup and hole drilling in the ZPP material, and charging of the ZPP. Our measurement of thickness of a ZPP film by energy-filtering TEM after extensive use, rules out contamination and hole drilling under the used conditions. From our observation of the CTF, a bright field image of the ZPP, and point projection holograms of the ZPP under electron beam irradiation, the most likely explanation appears to be charging of the carbon film of the ZPP.

Figure 5:
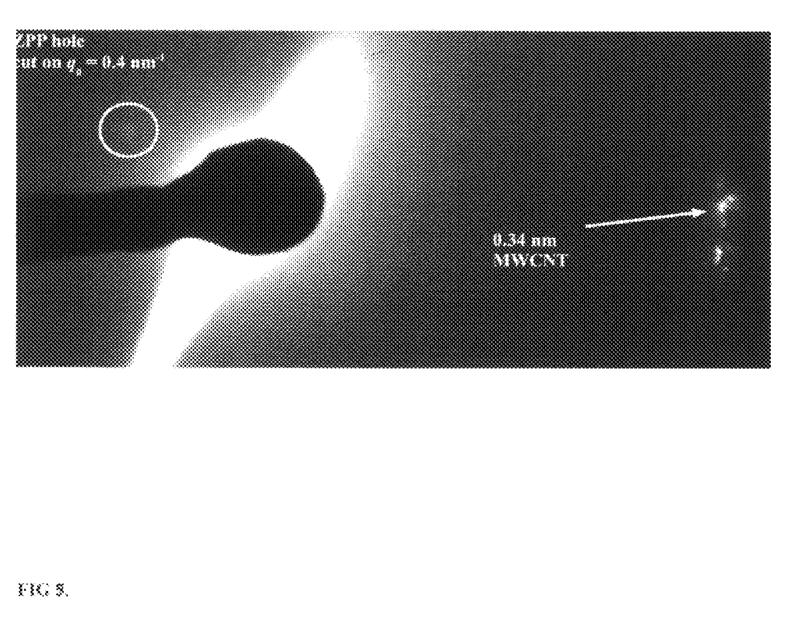
FIG. 5 shows the imaging conditions at reciprocal space plane for the image of FIG. 3b)

FIG. 5 shows the imaging conditions at reciprocal space plane for the image shown in FIG. 3b). The FIB fabricated hole is marked by a circle in the upper left corner while Bragg reflections originating from 0.34 nm lattice of MWCNT are marked by an arrow. In this case (FIG. 3b) and FIG. 5) the ZPP hardware was placed in selected area aperture plane and objective minilens was used to transfer the back focal plane of the objective lens to the selected area aperture plane that was conjugate with the back focal plane of the objective lens. FIG. 5 shows that the diameter of the ZPP hole was about 500 nm, and the angular width of the incident electron beam used in these experiments. The Bragg spots marked by an arrow originate from 0.34 nm spacing of multiwall carbon nanotube allowing us to accurately calibrate the imaging conditions in reciprocal space. The convergence angle of the incident Kohler illumination is about 40 μrad and the cut-on angle of the ZPP hole is about 100 μrad corresponding to phase shifting of spatial frequencies above 0.4 $nm^{-1}$ or 24 nm in real space.

Consequently, Applicant concludes that this new knowledge can be productively applied in transmission electron microscopy as follows: a method of preparing a transmission electron microscope for phase contrast imaging may involve placing a hole-free thin film at a back focal plane (BFP) or a plane conjugate thereto; focusing an electron beam of the transmission electron microscope for phase contrast imaging for an initial period of time during which charging and dissipation rates on the thin film are not in balance; and then performing phase contrast imaging once the charging and dissipation rates stabilize. It is possible that during the initial period the CTF changes involves changes in surface contamination layer thickness induced by the incident electron beam, in addition to the charging. A TEM is provided comprising an electron beam source, sample region, objective lens, and projection system wherein a hole-free amorphous or crystalline thin film is placed at a back focal plane or a conjugate plane thereof with the objective lens operated so that a scattered wave and unscattered wave are focused on different areas at the back focal plane.

In the foregoing examples, we focused on amorphous thin-film type ZPPs, but the implications of charging to electrostatic-type ZPPs can be used to generate a control signal to the einzel or Boersch lens to compensate for the charging. The smaller area of electrostatic-type ZPPs susceptible to charging, the broken radial symmetry of the ZPP caused by the structure of the ZPP, the large thickness of the conducting electrodes of the Boersch lens and the significant thickness of Boersch lens, which tends to stop primary electrons, are all factors that will change the charge balance in the device, in comparison with film type ZPPs.

Without wanting to be limited by the following theory in all aspects of this invention, applicant considers the charging to likely be produced by secondary emission of electrons. Emission of secondary electrons (SE) induced by an incident (primary) electron beam is a well established fact responsible for SE images in scanning electron microscope (SEM) and SE mode of scanning TEM (STEM) [17,18]. The number of SEs emitted per an incident primary electron (the SE yield) varies with incident energy, incident angle and irradiated material but is always non-zero [18]. The emission of SEs results in positive charge buildup on the irradiated object [19,20] such as Zernike phase plate (ZPP), the sample itself, an aperture, or polepiece and beam liner in a TEM. The positive charge is compensated by induced current flowing from a ground electrode and driven by a positive potential developed due to SE emission. Eventually a steady state develops, and the emitted SEs are fully compensated by induced current from ground electrode. The period it takes for a steady state to develop as well as the steady state itself can be affected by possible surface contaminants layers. A beam-induced surface contamination build up produces phase shift in addition to the charging. It is important to note that the steady state requires a gradient of electrostatic potential continuously driving the electric current from the ground electrode to the area where SEs are generated by an incident primary beam [19,20]. The steady state can develop rapidly with small gradient of electrostatic field in good conductors, while a footprint of a charged area can remain for appreciable period of time after the primary beam was removed in poorer conductors [21,22].

The presence of a SE emission-induced electrostatic potential described above leads to an electrostatic phase shift (EPS) of the primary electrons in addition to phase shift induced by the mean inner potential (MIP) of the ZPP film including surface contaminants [23] or the electrostatic phase shift in electrostatic-type ZPPs. The electrostatic potential, and consequently the EPS, can be significant, even for moderate charge densities resulting from SE emission [20].

Whatever the origins of the charging, a model of the effect of static charge on an object (such as the ZPP) in the back focal plane on the contrast transfer function may be used. These models may not be accurate, and empirical and/or semi-empirical procedures may be chosen to compute the desired field strengths of electrostatic-type ZPPs, or to compute a desired thickness for an amorphous thin film ZPP suited to desired operating conditions within a TEM, or conversely for selecting operating conditions for an amorphous thin film ZPP of a given thickness, with or without a hole of a given size. Particularly the condenser settings can be controlled to empirically optimize the contrast directly observed on a digital camera located at the image plane of the microscope.

Charging of various objects in the beam path can have profound effect on the electron optics of a TEM. All objects that emit SE upon incidence of a primary electron are subject to some degree of charge redistribution leading to an electrostatic potential. In case of broad beam illumination at a sample plane of a TEM, the effect of the electrostatic potential (bias) due to SE emission adds a constant phase shift across the entire illuminated area leading to no observable effect (it is the square of the amplitude that forms an image, a constant phase shift is therefore not observed). For most biological samples the scattering is very weak and diffuse (as opposed to strong Bragg reflections observed in crystals) leading to smooth (i.e. not a step function) current density profile at the back focal plane where the ZPP is placed. In case there is a time-dependent component in the bias, a beehive effect [28] can be observed.

When a bias is non-uniform (and even more so when it acts in reciprocal space) such as in the back focal plane of a lens, the charging may strongly affect the resulting image, which would explain the demonstrated phase contrast imaging on a hole-free ZPP. In particular, a spatial frequency-dependent phase shift, as found in a charging ZPP, can entirely dominate the contrast formation mechanism in a TEM.

In the case of Zernike phase plates, an object located in high current density area in the back focal plane of a TEM, it is considered possible that charging can be sufficient to generate a potential leading to significant alternation of electro-optical properties of the phase plate. For our particular example the calculated charge-induced phase shift near $q=0$ the phase shift exceeds the $\pi/2$ by nearly an order of magnitude. The applicant concludes from the profiles of the CTF in FIGS. 2b) and 2c) and FIG. 3d) that using a thin-film ZPP, the phase shift due to charging can entirely mask the $\pi/2$ shift desirable for Zernike contrast in TEM [23].

It is common practice in TEM and SEM to coat a sample with thin film of carbon or other material to reduce charging of a non-conducting sample. It should be emphasized that the carbon or similar coating only reduces the charging, but does not eliminate the SE and charging, as readily witnessed by ability to obtain SE images from carbon-coated samples in STEM and SEM.

Charging can be readily observed when the microscope optics is set up for point projection holography; a cross over is formed at a small distance above the sample and defocused image of the sample is projected onto a screen. Although uniform (long-range) and time independent charge induced phase shift would be as difficult to detect in point projection set up as it is in off-axis holography and in BFTEM, instabilities in charging can be readily observed in point projection holography up as they induce minor sample jumps (for large instabilities). The charging of an object at an image plane (sample) due to SE emission can be responsible for apparent increase of mean inner potential of nanoparticles with decreasing particle size [32].

To image an object at low irradiation dose it is most important to correctly transfer the lowest spatial frequencies [16], i.e. near $q=0$. Adjusting the phase shift of the direct beam (near $q=0$) to a phase shift $\pi/2+n\pi$ (n is an integer) with respect to (elastically) scattered beams should increase contrast and therefore decrease the irradiation dose needed for desired signal-to-noise ratio in the final image. Since the SE emission and charging and the resulting phase shift is proportional to beam current density $J(r)$ in the back focal plane, it can be in principle optimized by adjusting the condenser setting while observing contrast in the image.

In accordance with an embodiment of the invention, a method is provided for TEM imaging. The method involves inserting a ZPP (of any type) into a TEM at a back focal plane of the objective lens or a plane conjugate thereto; applying objective lens fields to focus an electron beam such that unscattered waves travel through a localized region of the ZPP (referred to as the centre of the ZPP), and scattered waves pass through a region surrounding the centre of the ZPP; and adjusting condenser settings of the TEM to optimize contrast within the image. For example, a suitable thin (carbon) film can be placed in one of the standard objective aperture discs, inserted in the beam path at a nearly arbitrary position in the direction perpendicular to the electron beam, and then current density can be adjusted by adjusting the condenser lens to improve contrast and the CTF. The contrast and CTF may be observed as an intensity profile of image and simultaneously as a live fast Fourier transform (FFT) of the image respectively. This is an important advantage in terms of aligning and positioning the thin film in the TEM.

In Situ Drilling

Another way that a hole-free thin film can be prepared for phase contrast imaging, in situ in a TEM, is for the electron beam to be focused on the thin film while no sample is placed in the beam, and operated at a high beam current so as to bore a hole in the thin film, to effectively form a standard ZPP. The intense electron beam naturally defines the center of the TEM, the position of the hole produced will therefore be aligned with the electron beam during operation. Furthermore, under suitable conditions, the hole size can be well matched to the incident beam angular width and the position of the hole is determined by the position of the incident beam in the reciprocal (q) space. In fact, the match of the fidelity of the optical conditions, such as appropriate hole size (cut-on spatial frequency q) to beam convergence angle and positioning, can exceed fabrication limits of focused ion beam techniques for producing thin-film ZPPs. This is an important advantage in terms of aligning and positioning the thin film in the TEM. The possibility to fabricate the hole in situ eliminates the need for focused ion beam boring, a fabrication step that is known to induce a Ga-ion contamination of the ZPP. No precision hardware is needed for positioning the ZPP device relative to the incident beam.

There are several physical mechanisms that may contribute to drilling of a hole under an intense electron beam [2] such as: radiolysis, electron stimulated desorption and electron beam sputtering or electron beam induced film etching by residual water vapor in the column. It appears that electron beam sputtering, which involves momentum transfer from the incident electron to the sample (or thin film) atoms, is the most suitable for practical reasons [27] providing a the ZPP film is suitably selected that is subject to electron beam sputtering. A suitable material that is subject to electron beam sputtering has to have a sputtering threshold below the incident electron energy (200 keV in our case) and a sputtering cross-section sufficiently high to drill a hole within a reasonable time through the entire film thickness. Most light elements with atomic number less than about 20 have sputtering thresholds below 300 kV and are therefore suitable material for in situ fabricated ZPP in standard TEMs. For example amorphous carbon has a sputtering threshold around 100 kV and an electron sputtering cross-section in the order of $\sigma = 8 \times 10^{-23}$ cm² at 200 keV incident electron energy. [27] The removal rate of the material from the ZPP film can be calculated [27] according to the equation $R = \sigma dJ/e$, where R is the removal rate of the film material in monolayers per second, J is the incident current density (constant over the drilled area) and e is the electron charge in Coulombs. For typical conditions that may be suitable for hole fabrication the incident current I=1 nA, desired hole diameter $d_h$=500 nm leading to $J = 5 \times 10^3$ A/cm² at the back focal plane of the objective lens, and film thickness t=22 nm (about π/2 at 200 kV) the hole drilling time is about 30 to 60 s. The rate of material removal is additionally affected by the presence of water vapour that enhances drilling rate, or by presence of contaminants that reduce the rate of drilling. Since the current used for typical low dose imaging is significantly lower than the above-mentioned value (typically below 0.1 nA), the in situ drilled hole can be used for at least 5 minutes to 10 minutes if all the incident current was further expanding the hole size. However, during the imaging (after a hole was drilled through the thin film), a significant fraction (over 90% for typical TEM sample) of the beam current passes through the hole in the ZPP film rather than sputtering the ZPP film further. With this in mind, the in situ drilled ZPP device can be used for several hours without significant change.

Figure 6:
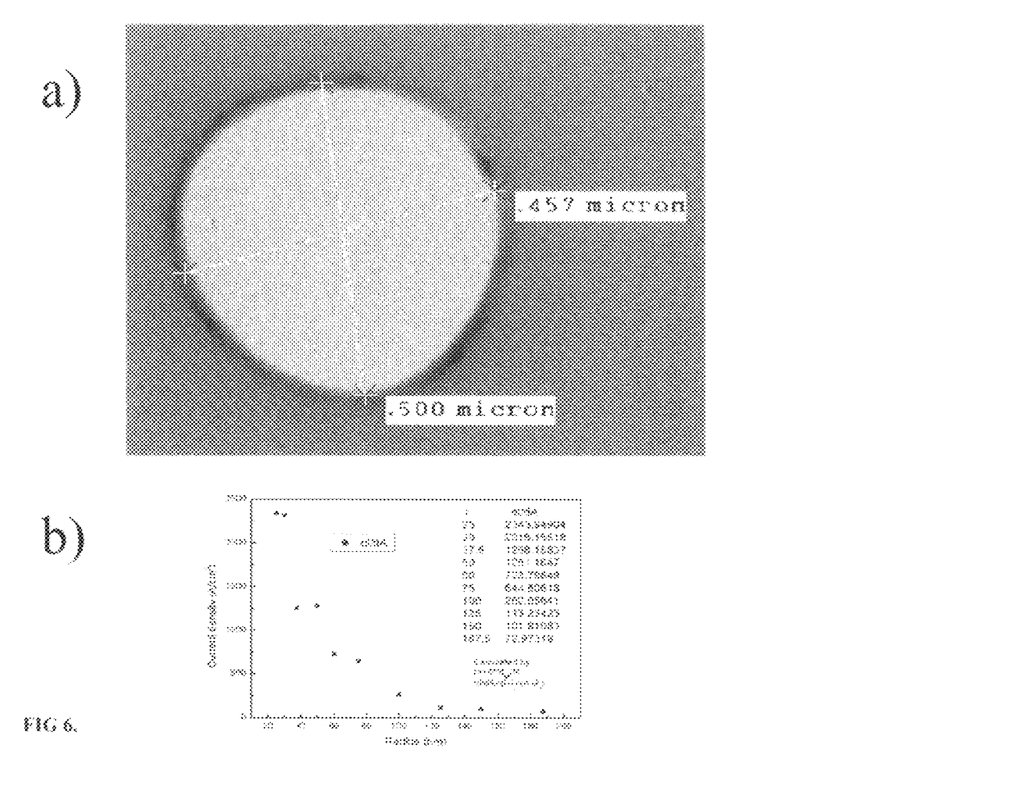
FIG. 6a) is an image of an in-situ drilled hole in thin carbon film.
FIG. 6b) is a table listing typical hole drilling parameters.

To demonstrate the possibility of hole drilling, several experiments were performed. FIG. 6a) shows an image of an in situ drilled hole in a thin carbon film having a ~500 nm hole drilled by a 200 keV LaB$_6$ instrument (JEOL 2010). The carbon film was placed at the sample plane in this experiment. A standard positioning mechanism (usually used at the selected area aperture or objective aperture) such as stepper motor driven selected area aperture mechanism in a JEOL2200 FS or manually positioned aperture assemblies in older microscopes provide sufficient drift stability for long term (hours) operation of the ZPP with typical dimensions of ZPP hole (200 nm to a few micrometers).

FIG. 6b) is a graph and table showing typical values of boring at a sample plane of a carbon thin film.

Following the method described above, the hole diameter (i.e. cut-on angle) will match the angular width of the incident illumination. Since the sample is not present in the beam path during the hole drilling step, the hole should be an accurate representation of the incident illumination shape in reciprocal (q) space. When a sample is inserted in the beam, the electrons scattered outside the angular width of the incident beam will be phase shifted by the in situ drilled ZPP device.

A typical sequence for phase contrast imaging using an in situ drilled amorphous thin film is as follows: align microscope and set microscope magnification; set the condenser lens for desired imaging condition, such as Kohler illumination, and desired current density; find a hole in the sample, and align the hole in the sample with the electron beam while passing through a hole in the sample; insert a ZPP film in the back focal plane or in a conjugate plane thereof: wait to for the incident beam to drill a hole in the ZPP film; move the sample from the hole to an area of interest, and start imaging the sample.

Positioning of Hole-Free Thin Film or ZPP

As noted above, Applicant has found advantages in placing a ZPP or hole-free thin film at conjugate plane to the back focal plane produced by a cross-over induced by an objective minilens after the objective lens. In accordance with the prior art, the ZPP is usually placed in the back focal plane (BFP) of the objective lens or a special transfer lens is incorporated in the microscope column to accommodate the ZPP. FIG. 7 shows ray path diagrams for a TEM having a ZPP or hole-free thin film at the SAA. In FIG. 7a) the objective minilens (OM) is turned ON for phase contrast imaging, and in FIG. 7b) the objective minilens turned OFF to realize a standard phase contrast, or diffraction contrast imaging mode.

As shown in FIG. 7a), a TEM equipped with an objective minilens, permits placement of the ZPP or hole-free thin film at a selected-area aperture (SAA) plane, such that the BFP is transferred to the SAA plane by suitable excitation of the objective minilens [23] making it convenient to install the ZPP or hole-free thin film. The lines furthest from the optical axis corresponds to a diffraction pattern and the lines closest to the optical axis corresponds to an image plane. The intermediate lens (post ZPP lens) is then used to focus the sample while the objective lens and objective minilens and condenser lens system stay unchanged.

The physical space available at the SAA plane is significantly larger than the space available at the back focal plane of the OL: the space at the SAA plane can be easily 10 mm along the beam path as well as in the plane perpendicular to the electron beam. Thus the use of objective minilens (OM) brings additional degrees of freedom to ensure that the ZPP hardware is in a plane accurately conjugated to BFP of the objective lens. In the case of a ZPP placed directly in the back focal plane, only the sample height and the focal length of the OL can be varied. When the OM is used an additional variable, the focal length of the OM can be used to optimize the electro-optical conditions.

An important advantage can be obtained by focusing with a lens below the ZPP or hole-free thin film, since any lens below the ZPP device does not affect the position of the back focal plane at the ZPP device. In the traditional operation the position of the conjugate plane of the objective lens moves along the optical axis as the objective lens (or objective minilens) is focused on the sample. The movement of the diffraction plane along optical axis can result in a change of alignment of the ZPP or hole-free thin film with respect to the conjugate of the BFP. Using condenser lenses to focus the back focal plane onto the ZPP device results in limited control over illumination conditions.

Applicants have demonstrated that a hole-free thin film can be prepared for phase contrast imaging in situ within a TEM. Phase plates with prefabricated holes, with in situ fabricated holes, and without any hole are subject to charging that provides a contrast transfer function that can be leveraged for phase contrast imaging. Additionally the hole-free thin film may be bored in situ to produce a standard thin-film type ZPP, without the difficulties associated with fabrication and alignment in the prior art.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

REFERENCES

1 F. Hosokawa, K. Nagayama, and R. Danev, U.S. Pat. No. 6,744,048 (2004).
2 R. F. Egerton, P. Li, and M. Malac, Micron 35, 399 (2004).
3 M. Malac, M. Beleggia, R. Egerton, and Y. Zhu, Ultramicroscopy 107, 40 (2007).
4 R. Henderson, Quarterly Reviews of Biophysics 28, 171 (1995).
5 P. E. Batson, Microscopy and Microanalysis 14, 89 (2008).
6 F. Zernike, Physica IX, 686 (1942).
7 R. Danev, R. Glaeser, and K. Nagayama, Ultramicroscopy 109, 312 (2009).
8 K. Nagayama and R. Danev, US Patent 2008/0202918 (2008).
9 T. Matsumoto and A. Tonomura, Ultramicroscopy 63, 5 (1996).
10 T. Masumoto, N. Osakabe, and A. Tonomura, U.S. Pat. No. 5,814,815 (1998).
11 E. Majorovits, B. Barton, K. Schultheis, F. Perez-Williard, D. Gerthsen, and R. Schroder, Ultramicroscopy 107, 213 (2007).
12 J. Shiue, C.-S. Chang, S.-H. Huang, C.-H. Hsu, J.-S. Tsai, W.-H. Chang, Y.-M. Wu, Y.-C. Lin, P.-C. Kuo, Y.-S. Huang, et al., Journal of Electron Microscopy 58, 137 (2009).
13 K.-F. Chen, C.-S. Chang, J. Shiue, Y. Hwu, W.-H. Chang, J.-J. Kai, and F.-R. Chen, Micron 39, 749 (2008).
14 K. Schutleis, F. Perez-Williard, B. Barton, D. Gerthsen, and R. Schroder, Review of scientific instruments 77, 033701 (2006).
15 R. Cambie, K. Downing, D. Typke, R. Glaeser, and J. Jin, Ultramicroscopy 107, 329 (2007).
16 M. Malac, M. Beleggia, R. Egerton, and Y. Zhu, Ultramicroscopy 108, 126 (2008).
17 L. Reimer, Transmission Electron Microscopy, 4th edition (Springer Verlag, 1997).
18 L. Reimer, Scanning Electron Microscopy (Springer Verlag, 1985).
19 J. Cazaux, J. Appl. Phys. 59, 1418 (1985).
20 J. Cazaux, Ultramicroscopy 60, 411 (1995).
21 K. H. Downing, M. McCartney, and R. M. Glaeser, Microscopy and Microanalysis 10, 783 (2004).
22 R. M. Glaeser and K. H. Downing, Microscopy and Microanalysis 10, 790 (2004).
23 M. Malac, M. Beleggia, M. Kawasaki, and R. F. Egerton, Microscopy and Microanalysis 15, Suppl.2, 1234 (2009).
24 F. Hosokawa, R. Danev, Y. Arai, and K. Nagayama, Journal of Electron Microscopy 54 (4), 317 (2005).
25 K. Harada, T. Akashi, Y. Togawa, T. Matsuda, and A. Tonomura, Journal of Electron microscopy 54, 19 (2005).
26 R. Egerton, Electron Energy Loss Spectroscopy in the Electron Microscope, 2nd edition (Plenum Press, 1996).
27 R. Egerton, R. McLeod, F. Wang, and M. Malac, Micronp. Submitted August 2009 (2009).
28 G. Curtis and R. Ferrier, Brit. Journal Appl. Phys. (J. Phys. D) 2, 1035 (1969).
29 A. Howie, Ultramicroscopy 98, 73 (2004).
30 W. Qu, C. Boothroyd, and A. Huan, Applied surface science 252, 3984 (2006).
31 O. L. Krivanek, Optik 45, 97 (1976).
32 S. Ichikawa, T. Akita, M. Okumura, M. Kohyama, and K. Tanaka, JEOL news 38, 6 (2003).

The invention claimed is:

1. A method of phase contrast imaging with a transmission electron microscope TEM including a sample holder, an objective lens assembly, one or more intermediate lenses, and an object plane, wherein the method comprises:
   placing a hole-free thin film at a back focal plane of the objective lens assembly, or at a plane conjugate thereto;
   preparing the hole-free thin film for phase contrast imaging using an electron beam having at least a component thereof focused to a small area on the hole-free thin film at a center of the electron beam; and
   subsequently imaging a sample in the sample holder by focusing unscattered waves of the electron beam onto a small area on the hole-free thin film, while scattered waves are distributed across the hole-free thin film to impart a phase offset between the scattered and unscattered waves.

2. The method of claim 1 wherein preparing the hole-free thin film comprises using the electron beam to modify electro-optical properties of the hole-free thin film to increase the efficiency of phase transfer by the TEM by charging.

3. The method of claim 1 wherein the electron beam has an incident electron energy between 100 eV and 1 MeV and the hole-free thin film has a thickness selected to apply a phase delay of $\pi/2+n\pi$, where n is an integer.

4. The method of claim 1 wherein preparing the hole-free thin film comprises using the electron beam to modify electro-optical properties of the hole-free thin film to increase the efficiency of phase transfer by the TEM by charging.

5. The method of claim 1 wherein the transmission electron microscope is a transmission electron microscope, wherein the electron beam is Kohler illumination having a convergence angle of up to about 1 mrad.

6. A method for transmission electron microscope imaging, comprising:
   inserting a hole-free thin film into the transmission electron microscope at a back focal plane of the objective lens or a plane conjugate thereto, wherein said transmission electron microscope comprises at least one lens downstream from the hole-free thin film;
   applying fields at objective lenses of the transmission electron microscope to focus the electron beam such that unscattered waves from a sample in the transmission electron microscope travel throughout a centre of the hole-free thin film, and scattered waves from the sample pass through the remainder of the hole-free thin film; and
   adjusting condenser settings of the TEM to improve contrast within the image.

7. The method of claim 6 wherein a lens downstream from the hole-free thin film is used to focus an image of the sample.

* * * * *